United States Patent [19]

Carney

[11] Patent Number: 4,652,333

[45] Date of Patent: Mar. 24, 1987

[54] ETCH PROCESS MONITORS FOR BURIED HETEROSTRUCTURES

[75] Inventor: James K. Carney, Eden Prairie, Minn.

[73] Assignee: Honeywell Inc., Minneapolis, Minn.

[21] Appl. No.: 746,494

[22] Filed: Jun. 19, 1985

[51] Int. Cl.[4] .................... H01L 21/306; H01L 21/00
[52] U.S. Cl. ................................... 156/626; 156/647; 156/649; 156/662; 29/569 L
[58] Field of Search ............... 156/626, 649, 627, 647, 156/662; 29/569 L

[56] References Cited

U.S. PATENT DOCUMENTS

| | | | |
|---|---|---|---|
| 3,833,435 | 9/1974 | Logan et al. | 156/649 X |
| 3,844,858 | 11/1974 | Bean | 156/626 |
| 4,099,305 | 7/1978 | Cho et al. | 156/649 |
| 4,257,011 | 3/1981 | Nakamura et al. | 29/569 L |
| 4,341,010 | 7/1982 | Tijburg | 156/649 |
| 4,366,569 | 12/1982 | Hirao et al. | 29/569 L |
| 4,426,702 | 1/1984 | Yamashita et al. | 29/569 L |

FOREIGN PATENT DOCUMENTS 180027 10/1983 Japan .................... 156/626

OTHER PUBLICATIONS

"Localized GaAs Etching with Acidic Hydrogen Peroxide Solts", by Don Shaw, Journal of Electro Chem Society, 4–1981, vol. 128, No. 4, pp. 874,876,878,880.
"Buried Multi-Hetero Structure GaAlAs Laser", Proceedings of 13th Conference on Solid State Devices, Tokyo, 1981, Japanese Journal of App. Physics, vol. 21, (1982), pp. 353–358.
"GaAs-Ga$_{1-x}$Al$_x$As Buried Heterostructure Injection Lasers" Journal of Applied Physics, vol. 45, No. 11, Nov. 1974, pp. 4899–4906.

Primary Examiner—S. Leon Bashore
Assistant Examiner—Thomas M. Lithgow
Attorney, Agent, or Firm—Omund R. Dahle

[57] ABSTRACT

This invention describes the use of etch process monitors or indicators to improve the reproducibility of etching hourglass shaped mesas for buried heterostructure laser/amplifier structures or integrated optical components in III-V compounds (e.g. GaAs/AlGaAs or InP/InGaAsP).

9 Claims, 4 Drawing Figures

ETCH PROCESS MONITORS FOR BURIED HETEROSTRUCTURES

The U.S. Government has certain rights pursuant to the terms of a contract MDA904-83-C-0454.

BACKGROUND AND SUMMARY OF THE INVENTION

The subject matter is generally directed to the field of the etching of hourglass shaped mesas in crystalline material. This is a standard process in the fabrication of buried heterostructure laser diodes and amplifiers. It is important to the device performance that the mesa width be precisely controlled. The invention is specifically directed to a visual in-process monitor or aid to the progress of the etching. This process might also be applied to the fabrication of other integrated optical components such as waveguides and couplers.

DESCRIPTION

Figure 1:
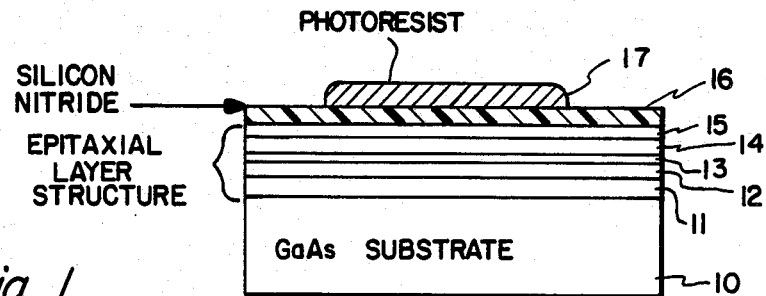
FIG. 1 is a pictorial cross-sectional view of a multilayer epitaxial structure on a semiconductor substrate (e.g. gallium arsenide (GaAs) or indium phosphide (InP)) in which long mesas are to be formed by etching. The photoresist defines the starting width on the etched mesa.

Referring now to FIG. 1, there is generally shown a multilayer epitaxially grown GaAs-AlGaAs or InP/InGaAsP structure for use in constructing a buried heterostructure laser. For these lasers the n-type substrate (e.g. GaAs) 10 has grown thereover by MOCVD (metal organic chemical vapor deposition) or MBE (molecular beam epitaxy) a number of layers. The epitaxial layers grown from the substrate 10 may include a GaAs buffer layer 11, a cladding layer 12 of $Al_xGa_{1-x}As$ where $x=0.3 \lesssim x \lesssim 0.4$, an active region 13, a cladding layer 14, and a GaAs layer 15. Over these epitaxial layers is shown a silicon nitride layer 16. The structure so far described is to be divided into one or many isolated lasers. For the buried heterostructure shown in the following Figures, the isolation is accomplished by etching.

Figure 2:
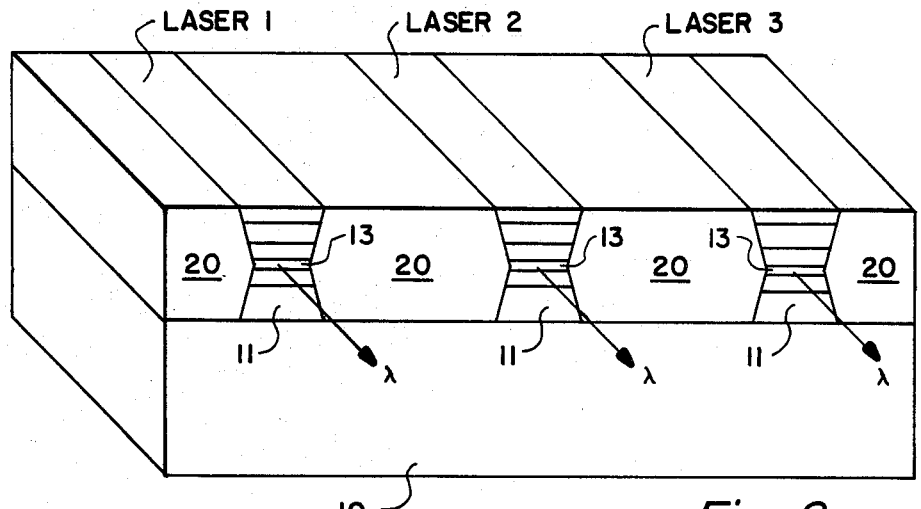
FIG. 2 is a diagrammatic end view of an array of integrated buried heterostructure lasers or optical amplifiers.

The unwanted epitaxial material between the individual buried heterostructure lasers (that is, in FIG. 2, between lasers 1, 2 and 3) is etched out leaving the lasers standing like mesas, and then the etched regions are refilled by growing cladding material 20 to fill the voids and thereby to provide isolation between the individual buried heterostructure lasers. The etching of the hourglass shaped mesas for buried heterostructure lasers and amplifiers is extremely critical, but is not well controlled because wet chemical etches are used. It is important to the device performance that the mesa width be tightly controlled. Up to now, only the length of time of etching has been used to determine the mesa width. This invention provides a visual aid to the progress of etching.

In the fabrication of buried heterostructures (BH) or buried optical guide (BOG) injection lasers or amplifiers, one of the most critical processing steps is the etching of the mesa stripe. Because of the crystalline structure of the semiconductor material and the action of the etching solution, a properly oriented etching mask (in the [110] direction on a (100) surface) will produce a mesa having an hourglass shaped cross-section (see FIGS. 2 and 3). The narrowest (i.e. waist) part of the mesa (mesa width) should be at the active layer 13. The mesa width determines many of the important device characteristics: lasing threshold current, single-mode operation, and maximum optical power. Therefore, an accurate knowledge of the mesa width is essential. The mesa widths are designed to be 1–3 microns, depending on the device application. The mesas are etched using a wet chemical solution. In general, wet chemical etches are not very controllable and some variation in etch rates will occur depending on solution strength, temperature, material composition, and doping. Thus, there can be large sample-to-sample variations in mesa width due to the etching.

Figure 3:
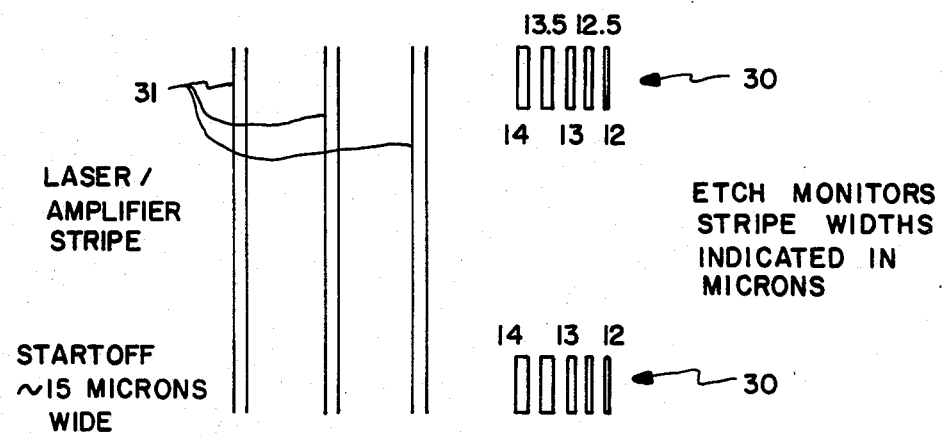
FIG. 3 is a top view of the photoresist pattern on the substrate prior to etching the widths of the laser/amplifier stripes and the etch monitors indicated in microns.
Figure 4:
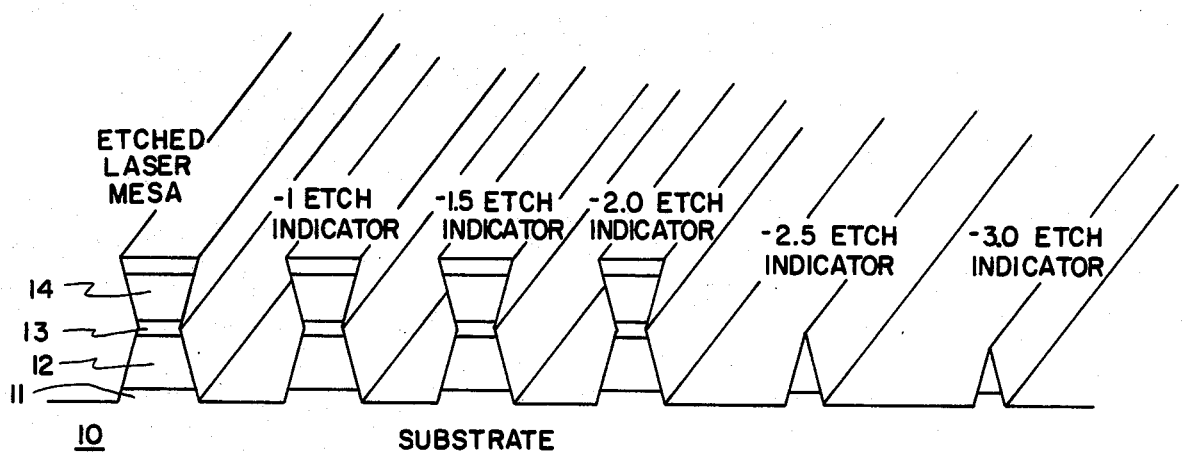
FIG. 4 is a pictorial view of the etched mesas on the buried heterostructure wafer. The etch indicators (−1 through −3) are used to deduce how wide the laser/amplifier mesa waist is by noting how many mesas have fallen off during etching.

The etching process monitors or etch indicators described in this invention provide accurate in-process information on the progress of the etching. Referring to FIG. 3, a top view of a mask, the etch monitors are a series of short stripes 30 which are placed on the photolithographic mask along with the stripes 31 to form the laser mesas. The width of the monitor stripes get progressively narrower in increments of 0.5 microns for example. For one embodiment of the etch mask the laser/amplifier stripe is 15 microns wide. The 5 monitor stripes in FIGS. 3 and 4 are 14L (−1), 13.5(−1.5), 13(−2), 12.5(−2.5), and 12(−3) microns wide. The negative numbers in parenthesis indicate how much narrower the monitor stripe is than the laser stripe.

The purpose of these lines is to monitor the progress of the mesa formation. During etching, the waist of the mesa becomes narrower. The final width of the mesa waist of the amplifier is designed to be 1.2 microns. If this were to be attempted using a single etch step, control would be very difficult. The wet etching for the mesas is not consistant enough to allow control by time and achieve a 1.2 micron wide mesa. The etch indicators give a close estimate of how wide the mesa width of the amplifier is. As the sample is etched, the waist of the narrowest mesas will go to zero and the top of the mesas fall off, starting with the 12 micron wide (−3) stripe. This can be seen by looking at the wafer from the top. When the 12 micron wide stripe falls off, it is known that the amplifier mesa width is between 2.5 and 3 microns. When the 12.5 micron wide (−2.5) stripe falls off, the amplifier mesas are less than 2.5 microns wide. The sample is allowed to etch until the indicator falls off which signifies the desired laser/amplifier mesa width and the etching is stopped. The sample is then cleaved through the mesa stripes and the mesa width is accurately measured in the scanning electron microscope (SEM). The final mesa etching occurs during the cleaning before regrowth when less than 0.5 microns of material is removed from each side of the mesa to obtain a 1.2 micron wide waist.

The embodiments of the invention in which an exclusive property or right is claimed are defined as follows:

1. A method for in-process monitoring of etching of hourglass shaped mesas for components such as buried heterostructure laser/amplifiers, the steps comprising:

providing a starting wafer of crystalline material which has been correctly oriented and on which it is desired to fabricate active or passive integrated optical components requiring stripe mesas;

applying, exposing and developing a photo resist pattern on the surface of said wafer to form a stripe defining mask, to be used in the formation of a stripe mesa, said stripe having [110] direction orientation on a (100) surface, the stripe defining mask being of a predetermined width, said pattern also including a plurality of graduated width short stripe defining masks, to be used in the formation of monitor mesas, parallel to said stripe defining mask, the width of each of said successive short stripes being slightly less than the width of the preceding short stripe, the width of the widest short stripe being equal to or slightly less than said predetermined width;

etching the entire pattern to simultaneously form the stripe mesa and the monitor mesas on said wafer, said etching continuing until at least one of the monitor mesas has been etched through and fallen off, said mesas all etching in an hourglass shape.

2. The method according to claim 1 in which the wafer crystalline material is a compound semiconductor.

3. The method according to claim 2 in which the wafer is a substrate of gallium arsenide (GaAs).

4. The method according to claim 2 in which the wafer is a GaAs/AlGaAs structure of a GaAs substrate having multilayer epitaxial layers formed thereon and on which structure it is desired to fabricate the stripe mesas.

5. The method according to claim 1 in which said plurality of short stripe defining masks are each about one-half micron smaller in width than the preceding short stripe.

6. A method for in-process detection of etch progression of buried heterostructure laser/amplifier mesas, the method steps comprising:

preparing a GaAs-AlGaAs wafer structure of multilayer epitaxial layers grown on a GaAs substrate and in which epitaxial layers are to be fabricated the buried heterostructure laser/amplifier devices;

coating photoresist to the surface of the multilayer wafer structure;

patterning the photoresist for etching laser stripes, to be used in the formation of stripe mesas, said pattern having [110] direction orientation on a (100) surface, the laser stripe defining pattern being of a predetermined width, said patterning also including a plurality of graduated and diminishing width short stripe defining patterns to be used in the formation of monitor mesas, the width of each of said successive short stripes being slightly narrower than the width of the adjacent short stripe;

etching the entire pattern to simultaneously form the stripe mesa and the monitor mesas on said wafer, said etching continuing until at least one of the monitor mesas has been etched through and fallen off, said mesas all etching in an hourglass shape.

7. The method according to claim 7 in which said predetermined width of the stripe defining mask is about 15 microns.

8. The method according to claim 7 in which said plurality of short stripe defining masks are each about one-half micron smaller in width than the preceding short stripe.

9. A method for end-point monitoring of etching of mesas for buried heterostructure laser/amplifiers, the steps comprising:

providing a GaAs-AlGaAs structure of a GaAs substrate having multilayer epitaxial layers formed thereon and on which structure it is desired to fabricate buried heterostructure laser/amplifier devices;

applying, exposing and developing a photoresist pattern on the structure of said multilayers to form a laser stripe defining mask, to be used in the formation of a stripe mesa, said pattern having [110] direction orientation on a (100) surface, the stripe defining mask being of a predetermined width, said pattern also including a plurality of graduated width short stripe defining masks parallel to said laser stripe to be used in the formation of monitor mesas, the width of each of said successive short stripes being slightly less than the width of the preceding short stripe, the width of the widest being equal to or slightly less than said predetermined width;

etching the entire pattern to simultaneously form the stripe mesa and the monitor mesas in said epitaxial layers, said etching continuing until at least one of the monitor mesas has been etched through and fallen off, said mesas all etching in an hourglass shape.

* * * * *